United States Patent
Daikoku et al.

(10) Patent No.: US 6,351,384 B1
(45) Date of Patent: Feb. 26, 2002

(54) DEVICE AND METHOD FOR COOLING MULTI-CHIP MODULES

(75) Inventors: Takahiro Daikoku, Ushiku; Junri Ichikawa, Hadano; Atsuo Nishihara, Kashiwa; Kenichi Kasai, Ushiku, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/637,468

(22) Filed: Aug. 11, 2000

(30) Foreign Application Priority Data

Aug. 11, 1999 (JP) .......................... 11-227211

(51) Int. Cl.[7] ............................... H05K 7/20
(52) U.S. Cl. .................. 361/704; 361/689; 361/690; 361/709; 361/717; 361/718; 257/712; 257/713; 257/714; 257/717; 257/721; 174/15.1; 174/16.1; 174/16.3; 165/80.3; 165/80.4
(58) Field of Search ................. 361/689, 698, 361/699, 700, 701, 704, 714, 717–720; 257/714, 715, 716; 174/15.1; 165/80.4

(56) References Cited

U.S. PATENT DOCUMENTS

| | | | | |
|---|---|---|---|---|
| 5,126,829 A | * | 6/1992 | Daikoku et al. | 257/713 |
| 5,239,200 A | * | 8/1993 | Messina et al. | 257/714 |
| 5,249,100 A | * | 9/1993 | Satoh et al. | 361/689 |
| 5,251,100 A | * | 10/1993 | Fujita et al. | 361/719 |
| 5,515,912 A | * | 5/1996 | Daikoku et al. | 165/80.4 |
| 5,774,334 A | * | 6/1998 | Kawamura et al. | 361/699 |

FOREIGN PATENT DOCUMENTS

| | | | |
|---|---|---|---|
| JP | 62-172798 | | 7/1987 |
| JP | 363169053 A | * | 7/1988 |
| JP | 401216558 A | * | 8/1989 |
| JP | 2257664 | | 10/1990 |
| JP | 06326226 | | 11/1994 |
| JP | 08-279578 | | 10/1996 |

OTHER PUBLICATIONS

Kikuchi, Shunnichi, "Cooling Plate," English abstract for Japanese laid open Publication No. 62–172798, Date of publication Jul. 29, 1987, (also JP Kokoku publication No. 7–70852).
Katto, Yoshiro, et al., "Dennetsugaku Tokuron," issued by Kabushiki Kaisha Yokendo, Tokyo, (Miyata, Yoshio, "Declaration," Feb. 24, 2001.

* cited by examiner

Primary Examiner—Leo P. Picard
Assistant Examiner—Boris L. Chervinsky
(74) Attorney, Agent, or Firm—Townsend and Townsend and Crew LLP

(57) ABSTRACT

A multi-chip module cooling device is provided which equally and efficiently reduces the rises in temperature of LSI chips, and which is superior in the productivity of multi-chip modules, such as their capability to be assembled and disassembled. A multi-chip module includes semiconductor devices and a sealing top plate for removing the heat generated by them. The sealing top plate has a number of parallel cooling channels and a number of cross grooves extending partially across the cooling channels. The cooling channels are covered with a cooling channel cover, which is provided with turbulent promoters on an inner wall thereof. When the cooling channel cover is placed over the sealing top plate, the turbulent promoters engage with the cross grooves. The turbulent promoters are positioned midway between adjacent semiconductor devices.

15 Claims, 4 Drawing Sheets

DEVICE AND METHOD FOR COOLING MULTI-CHIP MODULES

This application is related to and claims priority from Japanese Patent Application No. 11-227211, filed Aug. 11, 1999, the entire disclosure of which is incorporated herein by reference.

BACKGROUND OF THE INVENTION

The present invention relates to large scale integrated circuit chips (herein sometimes termed LSI chips) having semiconductor elements that provide high speed, high integration, high heat-generation density, high power dissipation, and large size. In particular, the invention relates to a cooling technique for removing, with low thermal resistance, the heat generated by a multi-chip module (MCM) in which a large number of LSI chips are mounted at high density.

As computers such as large mainframe and server computers, and super computers, gain higher computing speed and larger storage or memory capacity, LSI chips for use in them have become higher speed, highly integrated, larger and resulting in much greater heat-generation. To transmit signals at high speed among the LSI chips, the electric wiring among them should them as short as possible. Accordingly, such computers now often include MCM's each having a number of LSI chips mounted densely on a multi-layer circuit substrate. To avoid delay in signal transmission among the LSI chips, it is important for the MCM to be provided with suitable cooling to improve LSI chip operation by reducing the temperature and equalizing the distribution of temperature among the chips.

One conventional cooling device for removing heat generated by LSI chips mounted in an MCM includes a water-cooling jacket over the top of the MCM. Cooling water at a predetermined temperature flows in the jacket. For example, Japanese patent laid-open publication No. 08-279578 discloses a cooling device for an MCM. This cooling device includes a water cooling jacket having cooling channels formed in it. Cooling fins extend in parallel in the cooling channels. The cooling channels terminate in headers for reversing the direction of flow of the cooling water. The cooling water flowing in the jacket flows successively through the cooling channels, reversing in the direction of flow, to remove heat generated by the LSI chips in the MCM.

A common method for improving the cooling performance of a water cooling jacket involves deepening and/or narrowing the cooling channels in the jacket. For example, the deepened cooling channels make it possible to increase the heating surface areas, and to improve the cooling performance. If the same pump is used for cooling-water circulation, however, the cooling performance worsens because the total sectional area of the cooling channels increases, reducing the average flow velocity of the cooling fluid and the fin efficiency, as the channels deepen, although the decrease in pressure loss of the cooling fluid increases the total circulating flow rate of the cooling water. Accordingly, both of the foregoing actions or effects restrict the improvement of the cooling performance of a water cooling jacket.

If the total circulating flow rate is constant, the average flow velocity of the cooling fluid increases, thereby improving the cooling performance, but the pressure loss of the fluid increases quickly or suddenly, as the cooling channels narrow. If the same pump is used for cooling-water circulation, the increase in pressure loss reduces the total circulating flow rate, thereby restricting the improvement of the cooling performance of a water cooling jacket.

As the cooling channels narrow, the fluid flow through them transits or changes to laminar flow. This can be explained with a Reynolds number, a characteristic number representing the flow condition through cooling channels. The Reynolds number is found by multiplying the hydraulic equivalent diameter of cooling channels by the average flow velocity of the cooling fluid flowing through the channels, and dividing the resulting product by the kinematic viscosity of the fluid. The flow of cooling fluid through cooling channels is said to be turbulent if the Reynolds number is larger than a range between about 2,300 and about 3,000, and to be laminar if the Reynolds number is smaller than this range. As the cooling channels narrow, their hydraulic equivalent diameter decreases nearly in proportion to the channel width. On the other hand, the average flow velocity of the cooling fluid flowing through the cooling channels increases in inverse proportion to the channel width, but the total circulating flow rate decreases, and consequently the increase in the average flow velocity of the fluid is small. As a result, the Reynolds number decreases monotonically. Accordingly, as the cooling channels narrow, the flow of the cooling fluid changes to laminar flow. The foregoing description has been made on the assumption that the number of cooling channels is constant. If the cooling channels are narrower and the fins are thinner, however, the number of cooling channels is larger and accordingly the total sectional area of the channels is larger. This reduces the average flow velocity of the cooling fluid, making the Reynolds number even smaller. It is known that, in general, as the flow through cooling channels changes from turbulent flow to laminar flow, the Reynolds number decreases and the heat transfer performance of the channels decreases. Therefore, the improvement in cooling performance of a water cooling jacket is limited if its cooling channels are merely deepened and/or narrowed.

To remedy the foregoing disadvantages of methods for improving the cooling performance of general or common water cooling jackets, Japanese patent laid-open publication No. 7-70852 discloses prior art for improving the cooling performance of a water cooling jacket by locally reducing the sectional area of the cooling channel without changing the size of the entire channel. FIG. 7 is a cross section showing the principle of the improvement in cooling performance of a conventional water cooling jacket.

With reference to FIG. 7, a cooling device includes a cooling plate 41 having a flow channel 44. The cooling plate 41 is positioned in contact with an electronic part 42 at a place 43. An inner wall of the flow channel 44 has a protrusion 46 formed over the place 43. The protrusion 46 locally accelerates the flow of the cooling fluid through the flow channel 44, improving the heat transfer performance of that portion of the channel wall which is contacted by the accelerated flow. Immediately in front of and behind the protrusion 46, however, a separating phenomenon occurs in the fluid flow, decreasing the heat transfer performance. This phenomenon is described in Yoshiro Kato's "Dennetsugaku Tokuron" published by Yokendo on Oct. 5, 1984, page 211. Thus, the protrusion 46 and the electronic part 42 are in the same position on inner or outer both sides of an inner wall 45 of the cooling plate 41. If the protrusion 46 is smaller than the area of the place 43 where the electronic part 42 is in contact with the wall 45, the average cooling performance of the contact place 43 is such that the decrease in heat transfer performance in front of and behind the protrusion 46 and the increase in heat transfer performance just under the protrusion 46 cancel each other. This restricts the improvement in cooling performance of the cooling plate 41. If the protrusion 46 is larger than the area of the contact place 43, the region where the cooling fluid accelerates is longer, increasing the pressure loss of the fluid. Consequently, in either case, the improvement in cooling performance of the cooling plate 41 is limited.

Japanese patent laid-open publication No. 2-257664 discloses a device for cooling an MCM, which includes a large number of LSI chips mounted on a multi-layer circuit substrate. This cooling device includes a one-piece or integral water cooling jacket, which has cooling micro channels formed therein. The back sides of the LSI chips are soldered to the back side of the water cooling jacket. The cooling water flowing in the jacket removes the heat generated by the chips. The water cooling jacket serves as a cap for hermetically sealing the MCM.

If the one-piece water cooling jacket of this cooling device is larger in size for higher cooling performance, its heat capacity is even larger. In other words, because the back side of the one-piece jacket is soldered to the back sides of the LSI chips, it is necessary to melt or solidify the solder on the chips when assembling or disassembling the cooling device. When the solder is melted or solidified, a large temperature excursion is produced in the cooling jacket itself and/or between the jacket and other parts. This lowers the reliability of the LSI chip interconnections and the hermetic seal reliability of the MCM.

In recent years, as there has been need for the computing speed of computers such as large-scale or super computers to be even higher, LSI chips for use in them have been even more integrated, higher in heat generation density, larger in size, higher in power dissipation, and more densely mounted. For example, the LSI chip size may be as large as 15–20 mm square, and the heat generation density of the LSI chips may be as high as 100–150 W/cm². Very important problems arise with devices for cooling MCM's having numbers of LSI chips mounted on them which are high in heat generation density, large in size and high in power dissipation. These problems have not been serious for the conventional devices for cooling MCM's having LSI chips which are about 10 mm square in size and/or about 10–50 W/cm² in heat generation density.

One of the foregoing problems is that, because LSI chips are very high in heat generation density and/or power dissipation, their temperatures vary widely even with slight changes in cooling condition, and it is therefore difficult to lower the temperature rise of the chips and equalize the temperatures of the chips in comparison with the conventional cooling devices. The reason for this is that, for high computer performance, it is important to equalize the electrical characteristics of the many LSI chips mounted in an MCM. Accordingly, it is important to provide a cooling device for stable operation of a large number of LSI chips. This may be achieved by reducing the temperature rise of the LSI chips and the temperature difference among the chips so that no delay shift occurs in signal transmission among the chips.

Another problems is that, as LSI chips become larger in size and higher in heat generation density, it is more difficult to equalize the temperature distribution in the chips. The reason is that to equalize the electrical characteristics of the circuit elements in highly integrated LSI chips, it is important to equalize the temperature distribution in the chips. To prevent decreasing the reliability of the MCM, it is important to reduce the thermal deformation produced by the nonuniformity of the temperature distributions.

Another problem is that, for larger power dissipation of MCM's, a larger amount of cooling fluid needs to flow to cool the MCM's. It is therefore important to improve the cooling performance without increasing the pressure loss of the cooling fluid.

A further problem is that, for larger sizes of MCM's, the productivity of the MCM's, such as their capability to be assembled and disassembled, is considered to be very important in comparison with the conventional cooling devices. In particular, when soldering the back side of a semiconductor device and the sealing top plate of an MCM together, or hermetically sealing an MCM with solder or the like, it is necessary to heat and cool the whole MCM to melt and solidify the solder. For the thermal deformation produced when the MCM is heated and cooled to be kept small, it is important to equalize the thermal expansion coefficient of the MCM materials and/or make the heat capacity of each member small.

SUMMARY OF THE INVENTION

The present invention provides an MCM cooling device which efficiently reduces the temperature of highly integrated LSI chips generating substantial heat, which are densely mounted. The invention provides superior productivity of MCM's, enabling easier assembly and disassembly, and protects the LSI chips reliably.

In accordance with a first aspect of the present invention, a device is provided for cooling an MCM including a number of LSI semiconductor devices, packaged or unpackaged. The device includes a sealing top plate for removing the heat generated by the semiconductor devices. The MCM cooling device includes a plurality of parallel cooling channels formed in the sealing top plate and cross grooves extending partially across and through the cooling channels. The cooling channels are covered with a cooling channel cover, which has turbulent promoters formed on an inner wall thereof integrally with the channel cover. The cross grooves are positioned midway among adjacent semiconductor devices. By engaging with the cross grooves, the turbulent promoters disturb the flow of cooling fluid through the cooling channels to improve the cooling performance of the cooling channels. For the heat transfer enhancement of the cooling channels to be maximum locally near the middle of each semiconductor device, the height of the turbulent promoters may range between $\frac{1}{10}$ and $\frac{1}{16}$ of the pitch at which the semiconductor devices are arranged.

In accordance with a second aspect of the invention, an MCM cooling device is provided which has a plurality of parallel cooling channels formed in a cooling channel plate or a sealing top plate, cross grooves extending partially across the cooling channels, and turbulent promoters for engagement with the cross grooves. The turbulent promoters are formed on and integrally with an inner wall of a cooling channel cover. The cooling device also has a bypass channel formed in the inner wall of the cooling channel cover over the cooling channels so that cooling fluid can partially bypass said cooling channels through the bypass channel. This means both reduces the pressure loss of the cooling channels and improves their cooling performance.

In accordance with a third aspect of the present invention, an MCM cooling device is provided which has cooling channels formed in the sealing top plate of an MCM. The sealing top plate is made of a high thermal conductive ceramic having a thermal expansion coefficient matching with that of the multi-layer circuit substrate of the MCM. The cooling channels are covered with a cooling channel cover, which is a separate metallic member. The MCM includes semiconductor devices such as LSI chips or LSI packages, each of which contains an LSI chip. When the sealing top plate is soldered directly to the back sides of the semiconductor devices, the cooling channel cover is removed so that the heat capacity of the sealing top plate is small. A fastening means fastens the metallic cooling channel cover and the hermetic sealing frame of the MCM tightly to each other with an O-ring or another packing member interposed between a peripheral portion of the sealing top plate and the cooling channel cover. This prevents the leakage of cooling fluid while maintaining the strength of the ceramic sealing top plate. Consequently, the MCM cooling device raises the productivity of MCM's, such as their capability to be assembled and disassembled.

BRIEF DESCRIPTION OF THE DRAWINGS

Other objects and advantages of the invention will become apparent during the following discussion of the accompanying drawings, wherein.

DESCRIPTION OF THE SPECIFIC EMBODIMENTS

A first embodiment of the present invention will be described in detail with reference to FIGS. 1–4.

Figure 1:
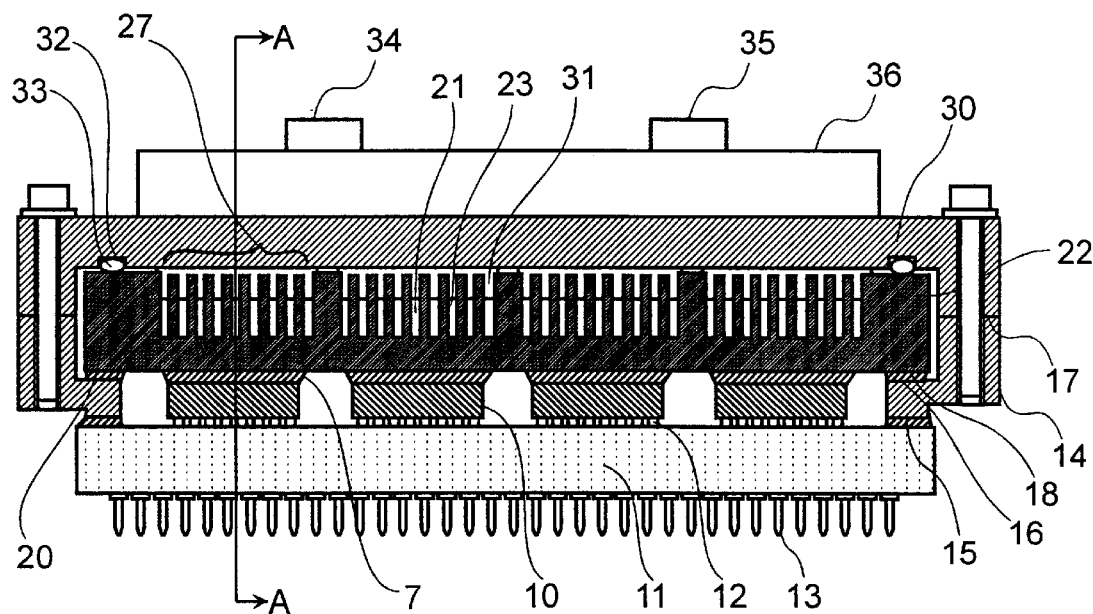
FIG. 1 is a cross section of a multi-chip module cooling device according to a first embodiment of the present invention.
Figure 2:
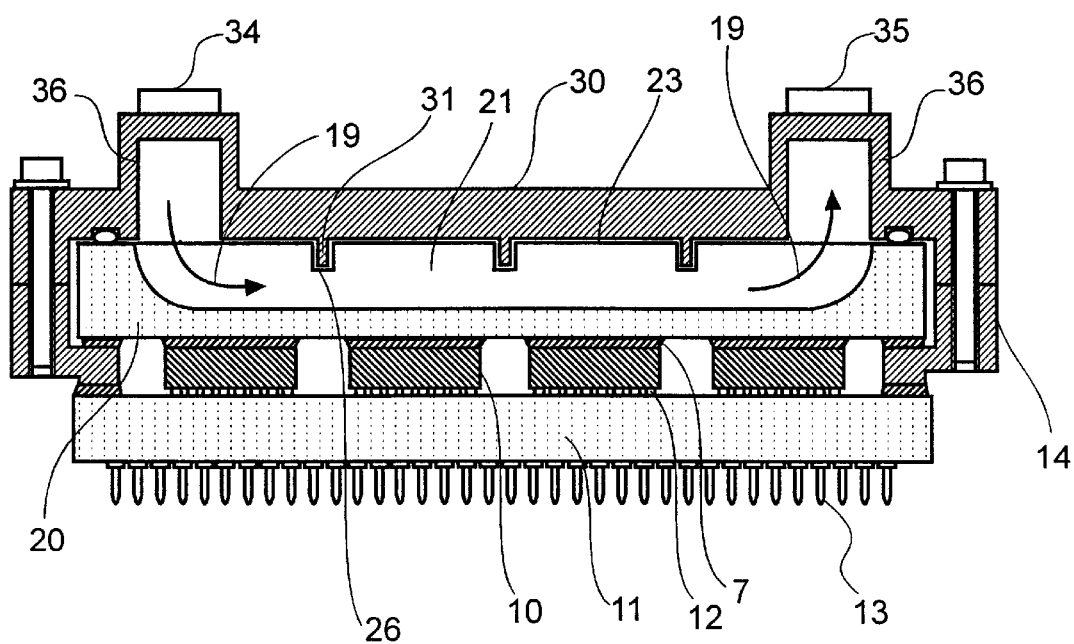
FIG. 2 is a cross section taken along line A—A of FIG. 1.
Figure 3:
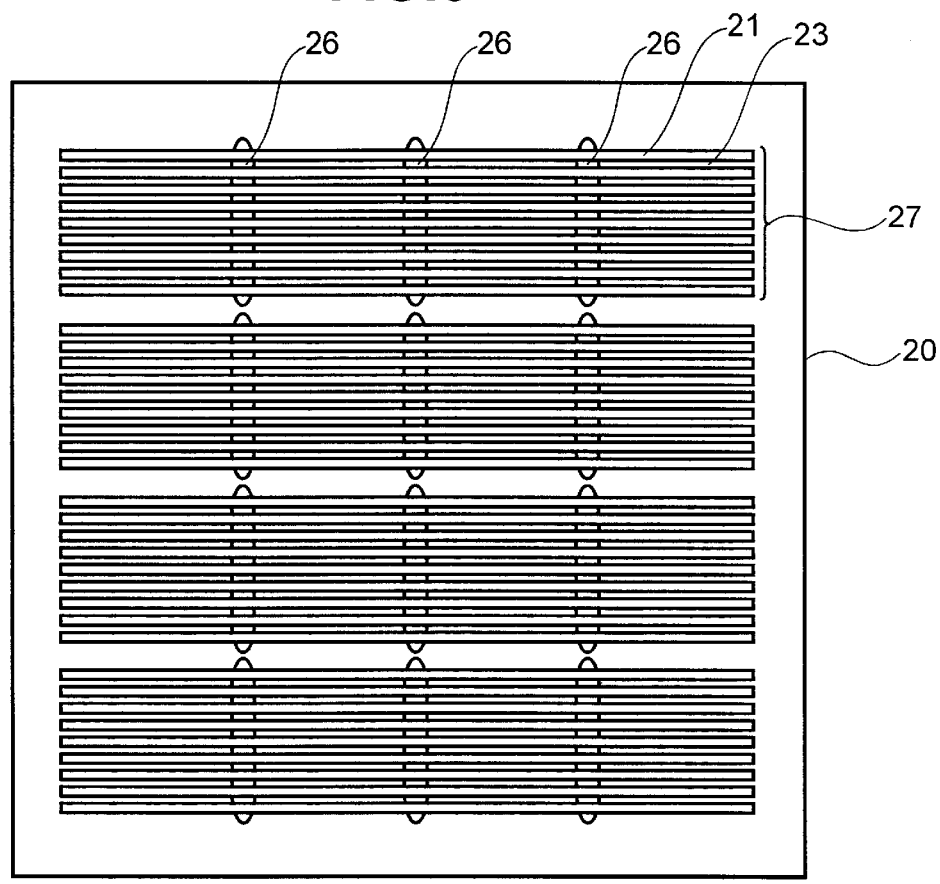
FIG. 3 is a top plan of the sealing top plate of the cooling device shown in FIGS. 1 and 2.
Figure 4:
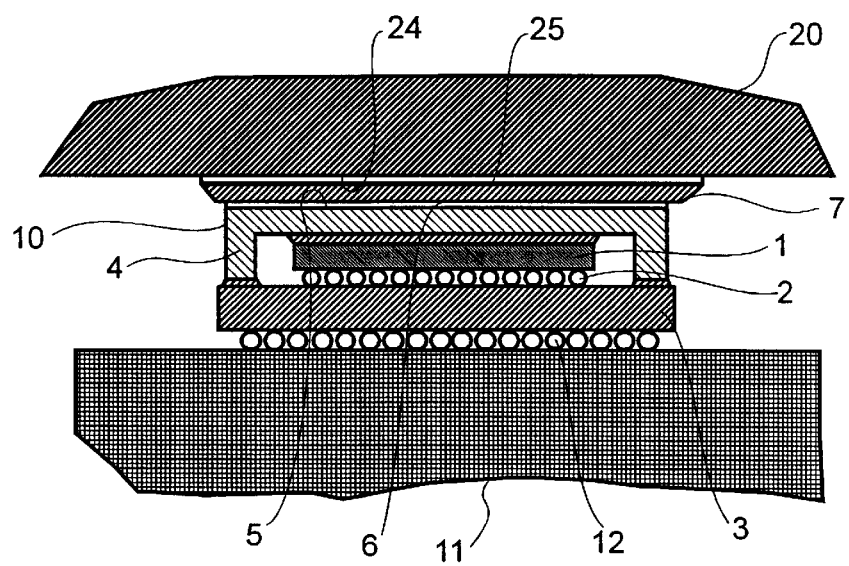
FIG. 4 is a fragmentary cross section showing in more detail one of the semiconductor devices of the multi-chip module shown in FIG. 1.

With reference to FIGS. 1 and 2, a multi-chip module includes four rows of four semiconductor devices 10, which are mounted with minute solder balls 12 on the top of a ceramic multi-layer circuit substrate 11. As shown in detail in FIG. 4, each semiconductor device 10 includes a micro package 4 covering an LSI chip 1 in sealed condition. The LSI chip 1 is mounted with minute solder balls 2 on a ceramic microboard or substrate 3. The top of the LSI chip 1 is soldered to an inner wall of the micro package 4. The bottom of the multi-layer circuit substrate 11 is fitted with input and output pins 13, through which the semiconductor devices 10 can be powered and signals can be transmitted to and from them.

The ceramics of the micro board 3 and the multi-layer circuit substrate 11 are a material which has a coefficient of thermal expansion matching that of the LSI chip 1. The ceramics contain low-resister electric wiring, and are a material which has a low dielectric constant and superior high-speed signal transmission. The ceramics may suitably be glass ceramics or mullite ceramics.

A frame 14, preferably iron-nickel alloy, which has a coefficient of thermal expansion matching that of the multi-layer circuit substrate 11. The bottom of the frame 14 is fixed to the periphery of the top of the multi-layer circuit substrate 11 by a solder joint 15. The frame 14 has flange surfaces 16 and 17. The flange surface 16 supports the periphery 22 of a sealing top plate 20, which has a large number of cooling channels 21 formed in parallel. The cooling channels 21 are divided into four groups 27. The cooling channels 21 are covered with a cooling channel cover 30, which is fixed to the flange surface 17.

Each row of semiconductor devices 10 is positioned just under one of the channel groups 27. The bottom 24 of the sealing top plate 20 is fitted with metallized layers 25 under the respective channel groups 27. The top 5 of each semiconductor device 10 is fitted with a metallized layer 6. The semiconductor devices 10 and the top plate 20 are fixed together by solder joints 7 each between the associated metallized layers 25 and 6. The thickness of each solder joint 7 depends on the accuracy of finishing and/or the assembling accuracy of parts of the multi-chip module, and generally ranges between 0.1 and 0.2 mm.

The bottom of the periphery 22 of the sealing top plate 20 is fitted with metallized layers (not shown). At the same time that the semiconductor devices 10 and the top plate 20 are soldered together, the flange surface 16 of the frame 14 and the periphery 22 of the top plate 20 are fixed together by a solder joint 18, which seals the multi-chip module hermetically or airtightly. For the solder joints 18 and 7, Sn37Pb (eutectic solder having a melting point of 183° C.) is suitable.

An inner wall of the cooling channel cover 30, which covers the sealing top plate 20, has an O-ring groove 32 formed over the periphery 22 of the top plate 20. An O-ring 33 engages with the groove 32 to prevent the leakage of the cooling fluid flowing through the cooling channels 21. The cooling fluid is sealed and the channel cover 30 is fixed by placing the O-ring 33 in the groove 32, aligning the bottom of the cover 30 with the flange surface 17 of the frame 14, and bolting the cover 30 and the frame 14 together. The channel cover 30 has a fluid inlet 34, a fluid outlet 35 and headers 36, where the direction of flow of the cooling fluid can be reversed. The channel cover 30 is preferably metal, for example, copper or stainless steel if the temperature of the cooling fluid flowing through the cooling channels 21 is almost the same as when the multi-chip module has been hermetically sealed and left to stand. If the temperature of the cooling fluid varies widely, however, it is preferable that the channel cover 30 be made of iron-nickel alloy, which has a coefficient of thermal expansion essentially matching that of the multi-layer circuit substrate 11.

The cooling channels 21 are defined by parallel fins 23 in the form of flat plates. The parallel fins 23 have cross grooves or recesses 26 formed in their top portions. The cross grooves 26 cross the channel groups 27 midway between adjacent semiconductor devices 10. An inner wall of the cooling channel cover 30 has turbulent promoters or accelerators 31 formed integrally with it in alignment with the cross grooves 26 of the parallel fins 23. Specifically, the turbulent promoters 31, too, extend midway between adjacent semiconductor devices 10. When the channel cover 30 is placed over the sealing top plate 20, the turbulent promoters 31 engage with the cross grooves 26.

It is preferable that the sectional form of the turbulent promoters 31 be a narrow rectangle, a triangle, knife edge form or the like so that their edges can disturb the flow 19 of cooling fluid through the cooling channels 21 when the fluid crosses over the promoters 31. The turbulent promoters 31 increase the pressure loss in the cooling channels 21. To minimize pressure loss, the sectional form of the turbulent promoters 31 may be circular or semicircular. The height of the turbulent promoters 31 ranges between $1/10$ and $1/16$ of the pitch at which the semiconductor devices 10 are arranged in the direction of the fluid flow 19. This maximizes the heat transfer performance of the channel groups 27 locally around the middle of each semiconductor device 10.

It is preferable that the sealing top plate 20 be a material having a low expansion coefficient which matches the coefficient of thermal expansion of the ceramic multi-layer circuit substrate 11. It is also preferable that the sealing top plate 20 be a ceramic having such characteristics that the ceramic is high in thermal conductivity because it conducts with low thermal resistance the heat generated by the semiconductor devices 10, and that the ceramic has strength against the pressure of the cooling fluid flowing through the cooling channels 21. It is particularly preferable that the sealing top plate 20 be made of high thermal conductive aluminum nitride (ALN). Likewise, it is preferable that the micro package 4 be made of high thermal conductive aluminum nitride (ALN).

The foregoing structure enables the heat generated from the LSI chips 1 to be emitted efficiently through the micro packages 4, the solder joints 7 and the interior of the sealing top plates 20 into the cooling fluid flowing through the cooling channels 21. In particular, because the sectional form of the turbulent promoters 31 is a narrow rectangle, a triangle or knife edge form, their edges well disturb the flow 19 of cooling fluid through the cooling channels 21 when the fluid crosses over the promoters 31. As a result, it is possible to raise or improve the heat transfer rate on the parallel fins 23 from a laminar flow characteristic to a turbulent flow characteristic.

As mentioned, the height of the turbulent promoters 31 ranges between 1/10 and 1/16 of the pitch at which the semiconductor devices 10 are arranged in the direction of the fluid flow 19. Consequently, after the cooling fluid crosses over the turbulent promoters 31, and the fluid flow separates, the flow sticks again near the middle of each semiconductor device 10. This maximizes the heat transfer performance of the channel groups 27 locally around the middle of each semiconductor device 10.

In general, the heat conductivity of solder material is about 10–20 times as high as that of high heat conduction grease. Therefore, the heat generated from the semiconductor devices 10 can be conducted quickly with low thermal resistance to the cooling fluid flowing through the cooling channels 21.

In some instances, the top of the ceramic multi-layer circuit substrate 11 and/or the soldered surface of the sealing top plate 20 may be warped. Furthermore, one or more of the semiconductor devices 10 may be mounted in inclined or otherwise displaced positions. Also, the flange surface 16 of the frame 14 and/or the soldered surface of the periphery 22 of the sealing top plate 20 may be warped. Even in these cases, it is possible to absorb the warp, the inclination and/or the displacement because the solder joints 7 and 18 once melted, fill the gaps and then solidify. It is therefore possible to produce multi-chip modules easily at low cost.

When soldering the semiconductor devices 10 and the sealing top plate 20 together, and soldering the flange surface 16 of the frame 14 and the periphery 22 of the top plate 20 together, it is possible to separate the metallic cooling channel cover 30. This keeps the heat capacity of the sealing top plate 20 low, reducing the thermal deformation caused during heating or cooling, and consequently raising the connection reliability of the solder joints. Accordingly, assembly and disassembly of multi-chip modules is made simpler.

When the metallic cooling channel cover 30 is bolted to the frame 14 with the cover bottom aligned with the flange surface 17 of the frame 14, the force exerted to the ceramic sealing top plate 20 is only the surface pressure of the O-ring 33. It is therefore possible to raise the hermetic sealing reliability of the ceramic sealing top plate 20. The channel cover 30 is metallic. This strengthens the piping joints through which the cooling fluid flows from the fluid inlet 34 to the cooling channels 21 and from the channels 21 to the fluid outlet 35.

Each semiconductor device 10 is an LSI package containing an LSI chip 1. Alternatively, each semiconductor device 10 might be a simple LSI chip. The sealing top plate 20 serves both to hermetically seal the MCM and as the cooling channel plate of the cooler. Alternatively, the sealing top plate for hermetically sealing the MCM and the cooling channel plate of the cooler might be separate members. The turbulent promoters 31 are integral with the channel cover 30, but might alternatively be separate from it.

Figure 5:
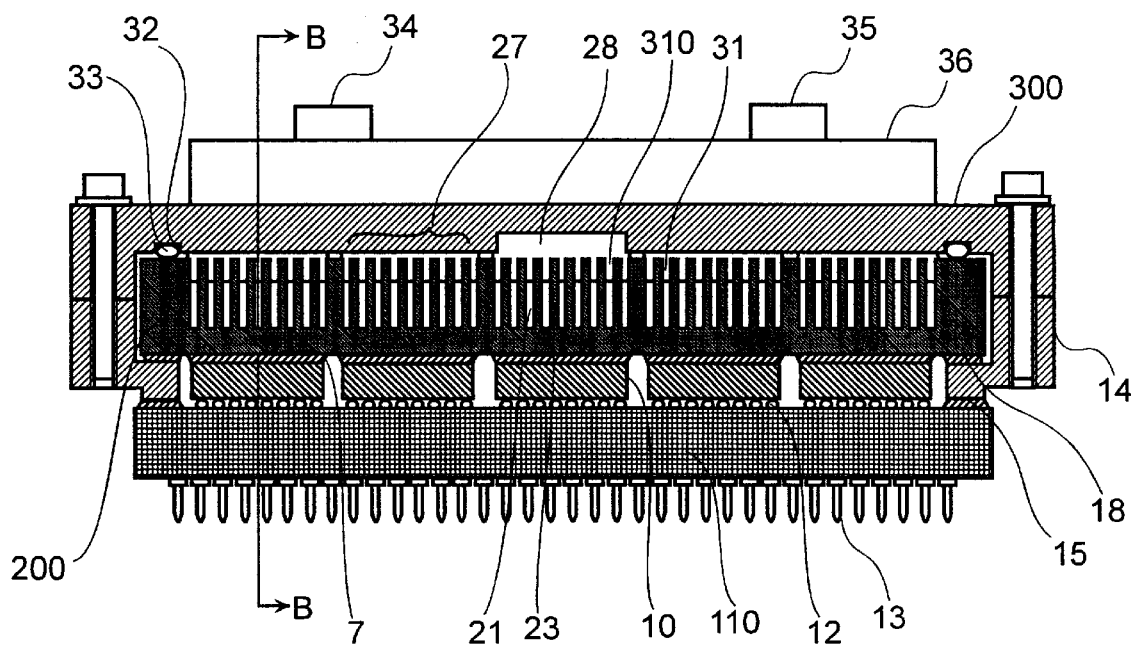
FIG. 5 is a cross section of a multi-chip module cooling device according to a second embodiment of the present invention.
Figure 6:
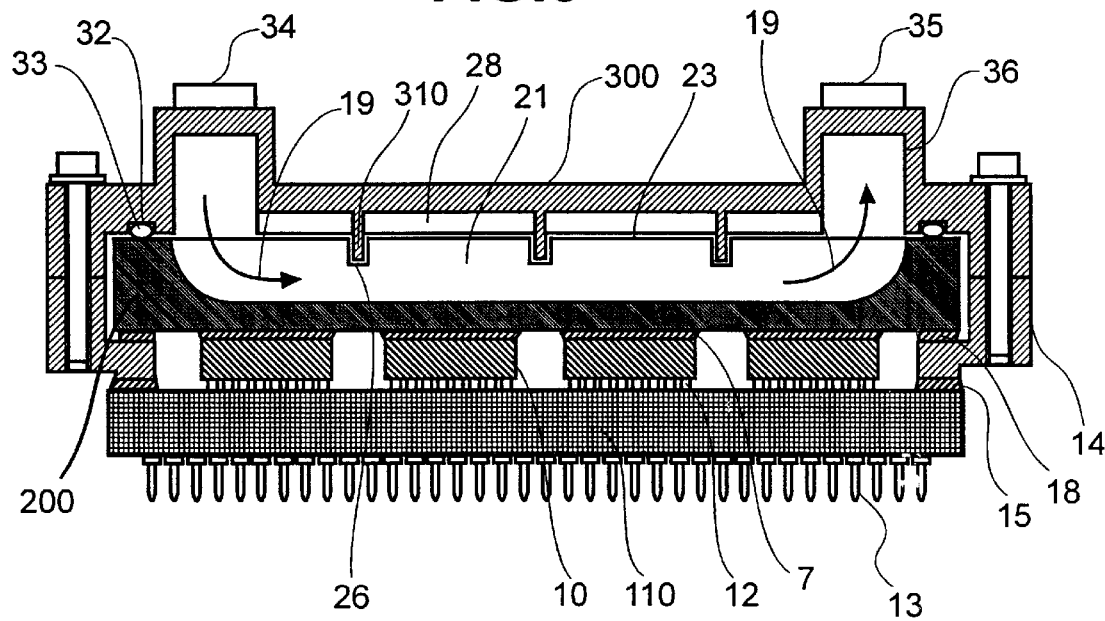
FIG. 6 is a cross section taken along line B—B of FIG. 5.
Figure 7:
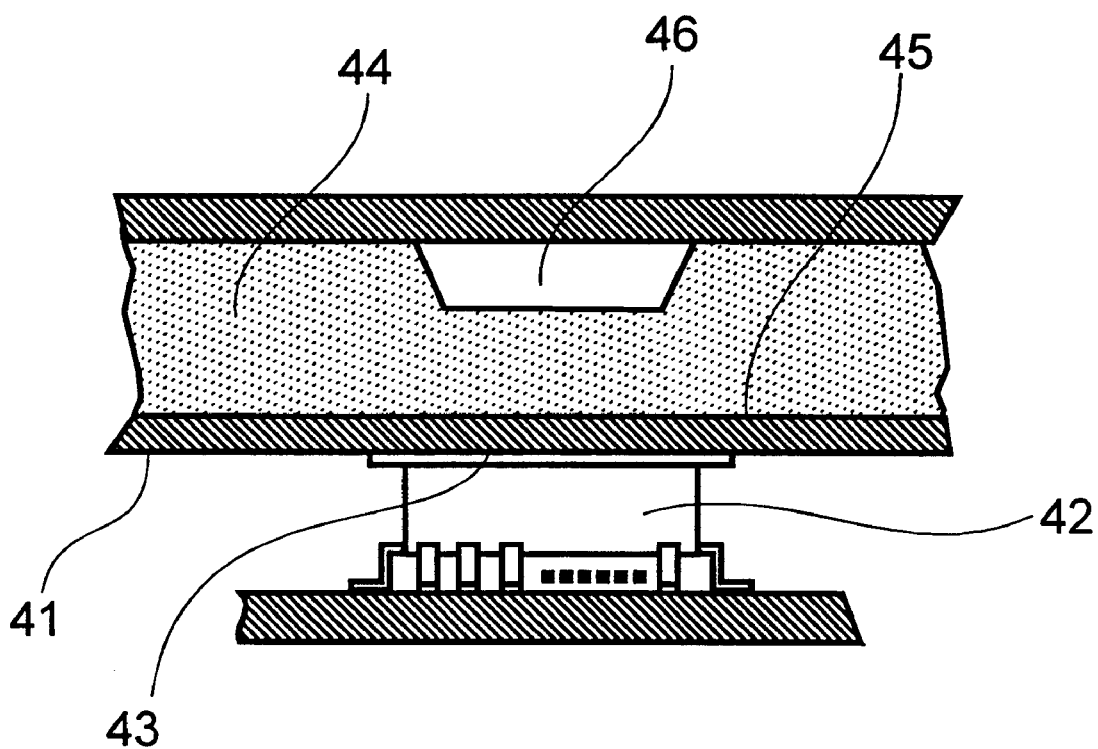
FIG. 7 is a fragmentary cross section showing the principle of improvement in cooling performance of a conventional multi-chip module cooling device.

A second embodiment of the present invention will be described with reference to FIGS. 5 and 6, in which the counterparts of and/or the equivalents to those shown in FIGS. 1–4 are assigned the same reference numerals. FIG. 5 is a cross section of a multi-chip module cooling device according to this embodiment. FIG. 6 is a cross section taken along line B—B of FIG. 5.

The multi-chip module of this embodiment includes five rows of four semiconductor devices 10 mounted on a multi-layer circuit substrate 110. A sealing top plate 200 has a large number of cooling channels 21 divided into five groups 27, which extend over the respective rows of semiconductor devices 10. The channel groups 27, which are positioned below a fluid inlet 34 and a fluid outlet 35, will now be studied with reference to FIG. 5. For example, the cooling fluid flowing from the fluid inlet 34 flows in parallel through the two channel groups 27 positioned under the inlet 34, and then turns to the middle or center channel group 27. Because the middle channel group 27 is a single group, however, all the cooling fluid for the two groups 27 could flow through it. For this purpose, a cooling channel cover 300 has a bypass channel 28 formed in an inner wall thereof just over the middle channel group 27 so that part of the cooling fluid can bypass the cooling channels 21 of this group.

The inner wall of the cooling channel cover 300 has turbulent promoters 31 and 310 formed integrally with it in alignment with the cross grooves 26 of parallel fins 23. The turbulent promoters 310 extend across the middle channel group 27. The turbulent promoters 31 extend across the other four channel groups 27. The turbulent promoters 31 and 310 are positioned midway between adjacent semiconductor devices 10. When the channel cover 300 is placed over the sealing top plate 200, the turbulent promoters 31 and 310 engage with the cross grooves 26. Even though the number of channel groups 27 is odd, part of the cooling fluid bypasses the middle channel group 27 through the bypass channel 28 in the inner wall of the channel cover 300 over this channel group. This reduces the average flow velocity of the cooling fluid flowing through the cooling channels 21, thereby making it possible to reduce the pressure loss in the middle channel group 27. Even though the average flow velocity of the cooling fluid decreases, the turbulent promoters 310 disturb the fluid flow, thereby maintaining the improvement in heat transfer performance. It is therefore possible to reduce the pressure loss and promote the heat transfer performance at the same time.

In each of the first and second embodiments, the semiconductor devices and the sealing top plate are soldered together, but might alternatively be fixed with other high thermal conductive joints or junction such as high thermal conductive bond or adhesive, or high thermal conductive adhesive compound.

As stated above, the present invention makes it possible to reduce the temperature of highly integrated LSI chips which generate substantial heat, are large in size, high in power dissipation and densely mounted. As also stated, the invention is superior for production of MCM's, facilitating easier assembly and disassembly. As further stated, the invention makes possible protection of the LSI chips reliably for a long time. To prove or confirm the effects of the present invention, the following experiments were carried out.

Cooling channel plates were made of high thermal conductive aluminum nitride (ALN) and each had a thickness of 5.5 mm. The cooling channel plates defined 22 cooling channels at a pitch of 1.0 mm, each of which had a width of 0.5 mm and a depth of 4.0 mm. Cross grooves for engagement with turbulent promoters were formed through the cooling channel plates at intervals of 26 mm in the direction of flow of cooling fluid in such a manner that they crossed the 22 cooling channels. Each of the cross grooves had a width of 2 mm and a depth of 2.2 mm. The experiments were carried out with columnar or cylindrical, square and rectangular turbulent promoters. When turbulent promoters each having a width of 1 mm and a height of 2 mm and being rectangular in section were used, and cooling water flowed at flow rates of 3–10 L/min, it was possible to minimize the thermal resistance from the water inlet to the cooling channel plates, and it was confirmed that this thermal resistance could be 1.3–1.5 times as small as that in the case of no turbulent promoter being used.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

The preceding has been a description of the preferred embodiment of the invention. It will be appreciated that deviations and modifications can be made without departing from the scope of the invention, which is defined by the appended claims.

What is claimed is:

1. A device for cooling a multi-chip module including a circuit substrate, a plurality of semiconductor devices mounted on said circuit substrate, a frame fixed to said circuit substrate, wherein the cooling device further comprises:

a sealing top plate thermally joined to the semiconductor devices, the sealing top plate having a plurality of cooling channel plates defining parallel cooling channels and cross grooves extending partially across and through the cooling channel plates, the cross grooves being positioned midway between adjacent semiconductor devices, the sealing top plate including a peripheral portion mounted on the frame;

a cooling channel cover covering the cooling channels and having turbulent promoters provided on an inner wall thereof in alignment with the cross grooves;

a packing member preventing leakage of cooling fluid flowing through the cooling channel; and means for fastening the cooling channel cover and the frame to each other with a packing member interposed between the peripheral portion of the sealing top plate and the cooling channel cover.

2. The multi-chip module cooling device defined in claim 1, wherein the sectional form of the turbulent promoters is a narrow rectangle.

3. The multi-chip module cooling device defined in claim 1, wherein the height of the turbulent promoters ranges between $1/10$ and $1/16$ of the pitch at which the semiconductor devices are arranged.

4. The multi-chip module cooling device defined in claim 1, wherein the inner wall of the cooling channel cover has a bypass channel formed therein through which cooling fluid can partially bypass the cooling channels.

5. The multi-chip module cooling device defined in claim 1, wherein the back sides of the semiconductor devices are soldered to the sealing top plate, and wherein the peripheral portion of the sealing top plate is soldered to the frame.

6. The multi-chip module cooling device defined in claim 1, wherein the sealing top plate is a ceramic made of aluminum nitride having a high thermal conductivity, and wherein the cooling channel cover is metallic.

7. The multi-chip module cooling device defined in claim 1, wherein the semiconductor devices are micro packages each containing an LSI chip.

8. The multi-chip module cooling device defined in claim 1, wherein the semiconductor devices and the sealing top plate are thermally joined with a thermal conductive adhesive.

9. The multi-chip module cooling device defined in claim 1, wherein the semiconductor devices are simple LSI chips.

10. The multi-chip module cooling device defined in claim 1, wherein the turbulent promoters and the cooling channel cover are separate members.

11. A method for cooling a multi-chip module including a circuit substrate, a plurality of semiconductor devices mounted on said circuit substrate, a frame fixed to said circuit substrate, and a sealing top plate thermally joined to the semiconductor devices, the sealing top plate having a peripheral portion mounted on the frame, the cooling method including:

providing the sealing top plate with a plurality of cooling channel plates defining parallel cooling channels, the cooling channel plates having cross grooves extending partially across and through the cooling channel;

covering the cooling channels with a cooling channel cover having turbulent promoters provided on an inner wall thereof in alignment with the cross grooves; and disturbing the flow of cooling fluid through the cooling channels by means of the turbulent promoters engaging with the cross grooves.

12. The multi-chip module cooling method defined in claim 11, wherein the turbulent promoters are positioned midway between adjacent semiconductor devices.

13. The multi-chip module cooling method defined in claim 11, wherein the sectional form of the turbulent promoters is a narrow rectangle.

14. The multi-chip module cooling method defined in claim 11, wherein the height of the turbulent promoters ranges between $1/10$ and $1/16$ of the pitch at which the semiconductor devices are arranged.

15. The multi-chip module cooling method defined in claim 11, wherein the inner wall of the cooling channel cover has a bypass channel formed therein through which cooling fluid can partially bypass the cooling channels.

* * * * *